US009230182B2

(12) United States Patent
Yamada et al.

(10) Patent No.: US 9,230,182 B2
(45) Date of Patent: Jan. 5, 2016

(54) DEVICE FOR SETTING IMAGE ACQUISITION CONDITIONS, AND COMPUTER PROGRAM

(75) Inventors: Yukari Yamada, Mito (JP); Akemi Kondo, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 22 days.

(21) Appl. No.: 13/812,847

(22) PCT Filed: Jun. 8, 2011

(86) PCT No.: PCT/JP2011/003215
§ 371 (c)(1),
(2), (4) Date: Jan. 28, 2013

(87) PCT Pub. No.: WO2012/014363
PCT Pub. Date: Feb. 2, 2012

(65) Prior Publication Data
US 2013/0129200 A1 May 23, 2013

(30) Foreign Application Priority Data

Jul. 28, 2010 (JP) .................................. 2010-168778

(51) Int. Cl.
G06K 9/62 (2006.01)
G06K 9/20 (2006.01)
H01J 37/22 (2006.01)
H01J 37/28 (2006.01)

(52) U.S. Cl.
CPC ................ *G06K 9/20* (2013.01); *G06K 9/6202* (2013.01); *H01J 37/222* (2013.01); *H01J 37/28* (2013.01)

(58) Field of Classification Search
CPC ...... G06T 3/4053; G06T 5/50; G02B 21/367; G02B 21/002; G02B 21/008; H04N 5/23232
See application file for complete search history.

(56) References Cited

U.S. PATENT DOCUMENTS 7,026,615 B2    4/2006  Takane et al.
2008/0291300 A1* 11/2008  Hitomi et al. ................. 348/241

FOREIGN PATENT DOCUMENTS

JP    2-291649 A    12/1990
JP    10-031729 A    2/1998
(Continued)

OTHER PUBLICATIONS

International Search Report issued in International Appplication No. PCT/JP2011/003215 mailed Jul. 26, 2011.

*Primary Examiner* — Mark Roz
(74) *Attorney, Agent, or Firm* — McDermott Will & Emery LLP

(57) ABSTRACT

The present invention relates to a device (303) for setting image acquisition conditions for charged particle beam devices or the like. An image integration unit (402) forms a plurality of images with a number of different integrations (number of integrations 2, 4 . . . N) from one image (number of integrations N) acquired in advance. A pattern matching unit (403) matches the patterns of each of the plurality of images having a number of different integrations with template images registered in advance and then finds a score that shows the degree of matching between images. A selection unit (407) selects a number of integrations such that any variation in the scores is contained within a prescribed allowable range. The selected number of integrations is stored in a recipe of the device. Thus, it is possible to determine the number of integrations in the recipes without having to operate the device, and to set image acquisition conditions so as to allow a minimization of the processing time while maintaining a sufficient S/N ratio.

10 Claims, 14 Drawing Sheets

SCHEMATIC CONFIGURATION DIAGRAM OF CD-SEM

(56) References Cited

FOREIGN PATENT DOCUMENTS

| JP | 2002-328015 A | 11/2002 |
| JP | 2009-222609 A | 10/2009 |
| JP | 2010-087070 A | 4/2010 |
| JP | 2010-092949 A | 4/2010 |

* cited by examiner

SCHEMATIC CONFIGURATION DIAGRAM OF CD-SEM

SCHEMATIC DIAGRAM OF IMAGES ACQUIRED BY
CD-SEM AUTOMATIC LENGTH MEASUREMENT

DATA INCLUDED IN IMAGE WHERE THE NUMBER OF INTEGRATIONS IS N (N FRAMES)

IMAGES THAT CAN BE GENERATED FROM DATA ACQUIRED FROM ONE IMAGE

GRAPH INCLUDING SCORES THAT CAN BE ACQUIRED FROM ONE IMAGE

| | | IMAGE | | | | | SCORE AVERAGE / $3\sigma$ |
|---|---|---|---|---|---|---|---|
| | | 1 | 2 | 3 | 4 | ... | X | |
| THE NUMBER OF INTEGRATIONS (FRAME) | 4 | 410 | 300 | 380 | 240 | ... | 270 | 320/217 |
| | 8 | 500 | 445 | 475 | 430 | ... | 420 | 447/99 |
| | 16 | 565 | 550 | 580 | 525 | ... | 540 | 552/64 |
| | ... | ... | ... | ... | ... | ... | ... | ... |
| | N | 830 | 815 | 840 | 810 | ... | 815 | 822/38 |

EXAMPLE OF SCORE AVERAGE AND SCORE VARIATION ($3\sigma$) FOR EACH SCORE OF IMAGE AND FOR EACH NUMBER OF INTEGRATIONS

PATTERN MATCHING RESULT DETERMINATION FLOWCHART

PATTERN MATCHING RESULT DETERMINATION EXAMPLE

GRAPH INCLUDING LENGTH MEASUREMENT VALUES THAT
CAN BE ACQUIRED FROM ONE IMAGE

| | | IMAGE | | | | | LENGTH MEASUREMENT AVERAGE/3σ |
|---|---|---|---|---|---|---|---|
| | | 1 | 2 | 3 | 4 | ... | X | |
| THE NUMBER OF INTEGRATIONS (FRAME) | 4 | 52.8 | 45.9 | 52.2 | 40.5 | ... | 47.0 | 47.7/15.1 |
| | 8 | 52.5 | 58.5 | 51.3 | 46.0 | ... | 50.3 | 49.7/7.63 |
| | 16 | 52.7 | 51.1 | 52.7 | 50.6 | ... | 51.9 | 51.8/2.83 |
| | ... | ... | ... | ... | ... | ... | ... | ... |
| | N | 52.1 | 51.6 | 52.5 | 50.9 | ... | 51.8 | 51.8/1.8 |

EXAMPLE OF LENGTH MEASUREMENT AVERAGE AND LENGTH MEASUREMENT
REPRODUCIBILITY (3σ) FOR EACH SCORE OF IMAGE AND FOR
EACH NUMBER OF INTEGRATION

MEASUREMENT LENGTH RESULT DETERMINATION FLOWCHART

MEASUREMENT LENGTH RESULT DETERMINATION EXAMPLE

ACCEPTANCE OPTIMIZATION FLOWCHART

ACCEPTANCE OPTIMIZATION EXAMPLE

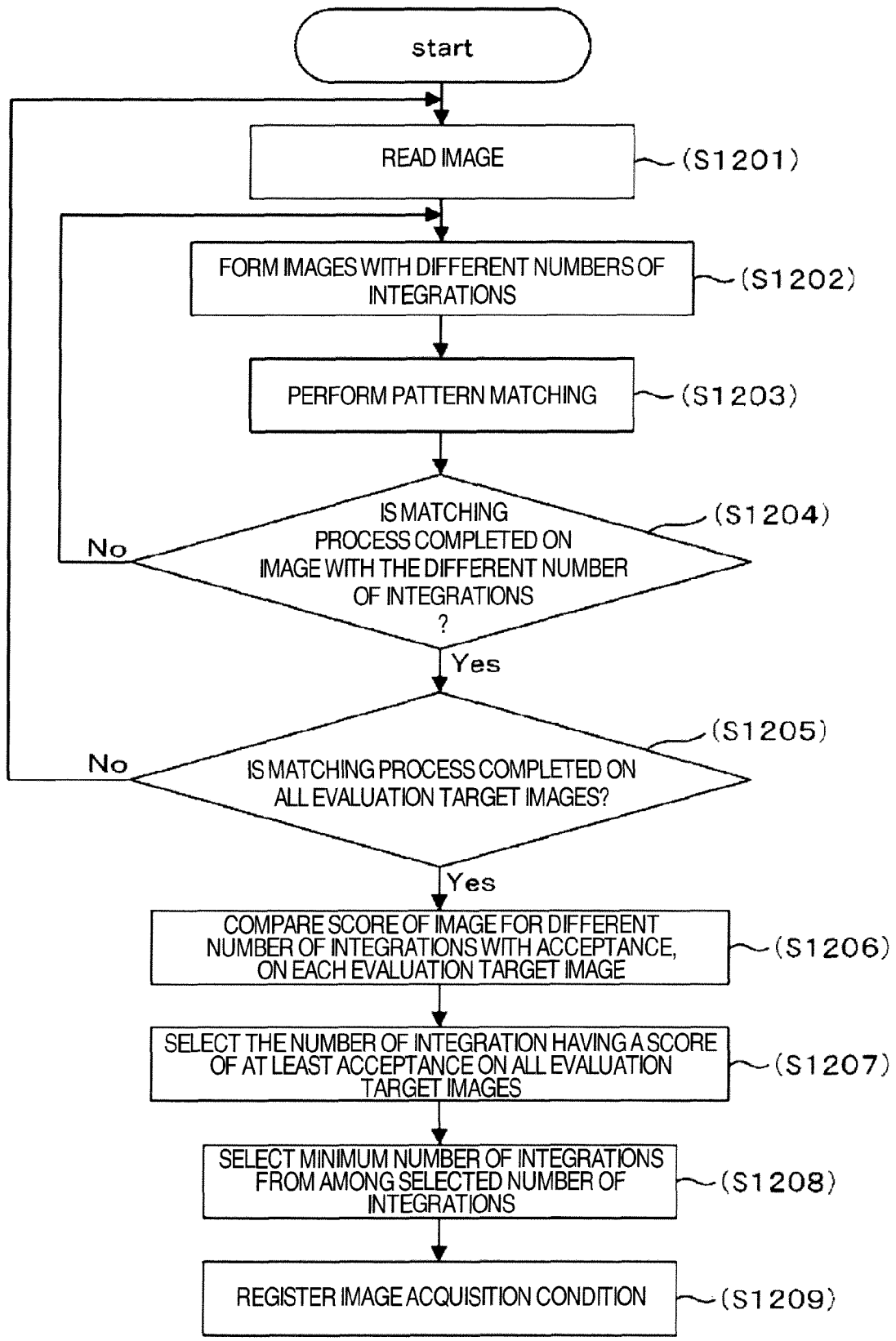

DEVICE FOR SETTING IMAGE ACQUISITION CONDITIONS, AND COMPUTER PROGRAM

RELATED APPLICATIONS

This application is the U.S. National Phase under 35 U.S.C. §371 of International Application No. PCT/JP2011/003215, filed on Jun. 8, 2011, which in turn claims the benefit of Japanese Application No. 2010-168778, filed on Jul. 28, 2010, the disclosures of which Applications are incorporated by reference herein.

TECHNICAL FIELD

The present invention relates to a device for setting image acquisition conditions, such as a charged particle beam device, typified by a scanning electron microscope, and a computer program. In particular, the present invention relates to a device and a computer program that set device conditions of a device of forming an image by integrating signals.

BACKGROUND ART

Recently, semiconductor processes have become further finer. Fine patterns are measured and inspected using a microscope. Images of processed patterns are taken by the microscope and displayed on a display, and inspection and measurement (which hereinafter may be simply referred to as "inspection") are performed using an image processing technique.

In the case of inspecting processed circuit patterns in the middle of semiconductor processes, inspection of all the patterns on a semiconductor chip is ineffective. Accordingly, areas where a malfunction tends to occur in the process or occurred in the past are specified, and inspection is performed.

At this time, it is significantly difficult to find the specified areas to be subjected to the inspection using a microscope having a high resolution. A method that is referred to as template matching disclosed in Patent Literature 1 is used.

The template matching is a method of specifying a desired target pattern in a search region on a sample. On each position in the search region, a degree of matching with a pattern image, which is referred to as a template, is determined, and a position indicating the highest degree of matching with the template in the search region is identified, thereby specifying the position. The operation is performed by a computer. More specifically, a plurality of gradation values representing the unevenness of a pattern in the microscope image are compared with a template diagram in a certain region. If the degree of matching is high, it is determined that matching is achieved. Preliminary registration of position information and the template allows automatic measurement.

CITATION LIST

Patent Literature

Patent Literature 1: JP-A-2002-328015

SUMMARY OF INVENTION

Technical Problem

A charged particle beam device, such as scanning electron microscope (SEM), is a device that forms an image on the basis of detection of charged particles (electrons or ions) emitted from a sample, and synchronizes a beam scanning signal and scanning of a display device with each other to thereby form a two-dimensional image. In this case, an image having a high S/N ratio is formed by integrating a plurality of image signals (frames). The number of frames is proportional to the number of scanning by a scanning deflector. As the number of frames increases, the amount of signals supplied to form an image increases. Accordingly, a large number of frames to be integrated enables an image having a high S/N ratio to be formed.

In a scanning electron microscope or the like that automatically measures and inspects a sample of a semiconductor device or the like, image acquisition conditions including the number of frames are required to be preset. Conditions of image signals provided for template matching are also required to be preset. A large number of integrations enables an image having a high S/N ratio to be formed as described above. However, unnecessary times of beam scanning increases processing time accordingly. This also causes a possibility that contaminates a sample, shrinks a pattern, or increases charging or the like. Accordingly, in order to maintain a high S/N ratio while suppressing processing time and the like, the optimum number of frames is required to be selected. However, Patent Literature 1 does not describe selection of an optimal number of frames for pattern matching.

Hereinafter, a device for setting image acquisition conditions and a computer program that have an object to set image acquisition conditions maintaining a high S/N ratio while suppressing processing time and the like will be described.

Solution to Problem

As an aspect to achieve the object, a device for setting image acquisition conditions and a computer program causing a computer to execute the processes are hereinafter proposed that include: an image integration unit that integrates a plurality of image signals and forms an image; and a pattern matching unit that performs pattern matching on the image integrated by the image integration unit using a preliminarily registered template, wherein the image integration unit changes the number of integrations on each of a plurality of preliminarily acquired integrated images, and forms a plurality of images with the different numbers of integrations, the pattern matching unit performs pattern matching on the plurality of images with the different numbers of integrations, and acquires a score representing a degree of matching between the template and a position specified by the template, and the device further comprises a selection unit that selects the number of integrations where variation in the scores is within a prescribed allowable range, the number of integrations where all the plurality of integrated images represent a score of at least a prescribed value, the number of integrations where variation in dimensions of a pattern specified by the pattern matching is within a prescribed allowable range, or the number of integrations where an average of dimensions of the pattern is within a prescribed range.

ADVANTAGEOUS EFFECTS OF INVENTION

The configuration can select the appropriate number of integrations for image acquisition using integrated images having already been acquired. Accordingly, appropriate image acquisition conditions can be set in accordance with process variation or the like.

BRIEF DESCRIPTION OF DRAWINGS

FIG. 18 is a flowchart illustrating a step of setting the appropriate number of integrations on the basis of pattern matching.

DESCRIPTION OF EMBODIMENTS

Figure 1:
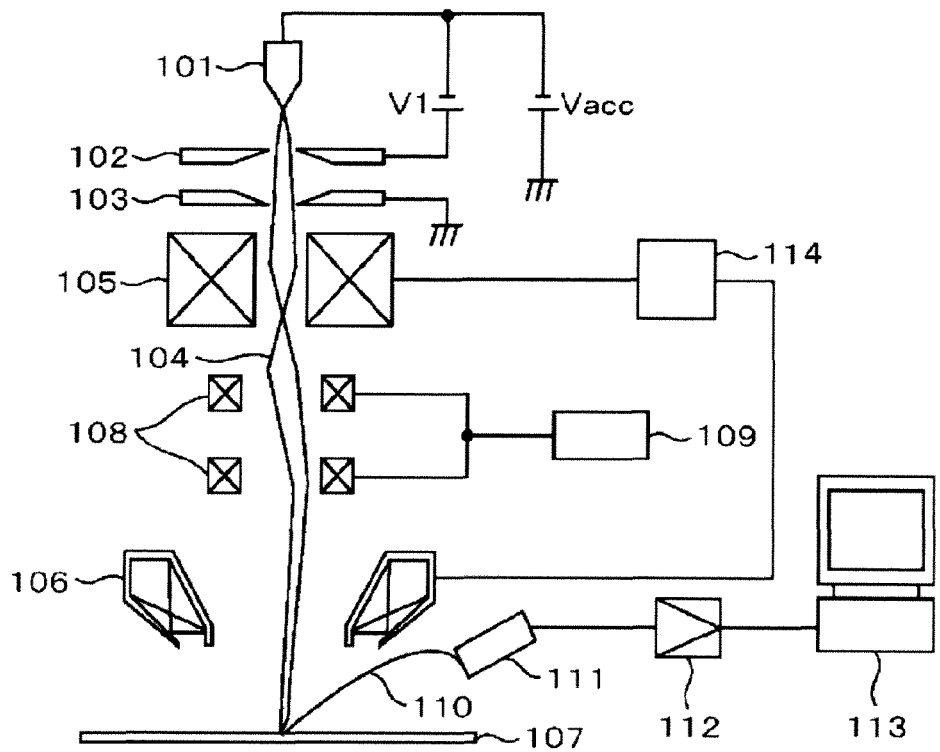
FIG. 1 is a schematic configuration diagram of a scanning electron microscope.

Microscopes include a type of emitting light and a type of emitting electron beams. The types are different in resolution. However, in some cases, both types can adopt the same image processing.

This is because, although an optical microscope with a high resolution causes a CCD sensor or the like to detect light reflected by a sample and an electron microscope having a higher resolution detects electrons generated on the sample, both types perform digital signal processing for imaging.

Image acquisition conditions (presence and absence of focus, the number of integrations, magnification, etc.) of an electron microscope and the like automatically measuring and inspecting a sample are to be preliminarily registered. However, a semiconductor manufacturing process includes process variation. Accordingly, conditions at the time of registration are sometimes incapable of appropriately extracting a pattern to cause a matching error.

In order to solve the problem, the number of integrations (the number of frames), which is one of the image acquisition conditions, may be set larger to sharpen the pattern. Unnecessary increase in the number of integrations unfortunately reduces the throughput. Furthermore, there is a possibility of increasing adverse effects of contamination, shrinkage, and charging.

Accordingly, measures to appropriately set the number of integrations according to process variation and the like are preferable to realize achievement of a matching success rate and reduction in processing time and the like. However, there are no clear indicator for appropriate setting, and is a possibility of erroneous setting. Accordingly, it is difficult to reset the number of integrations. Furthermore, erroneous setting may affect measurement results and the like, which is a cause of giving up resetting.

In many cases, an unnecessary number of integrations, which is one of image acquisition conditions requiring preliminary setting in the template matching method, are set. This setting is largely affected by contamination, shrinkage, charging and the like, while throughput is reduced. In order to solve the problem, it is preferred to correct the number of integrations to an appropriate number. The correction requires verification using a device and a sample. This verification prevents the device from being used for inspection, which is the original object, and results in reducing the operating ratio of the device. That is, once operation on a mass production line has started, it is significantly difficult to change the image acquisition conditions.

Hereinafter, a device for setting image acquisition conditions and a computer program that can find setting conditions of the device without using a device or a sample will be described in further detail.

In order to set device conditions without using a device or a sample, a method is proposed that sets conditions using images acquired by automatic measurement or automatic inspection. A critical dimension SEM (CD-SEM) is a device for continuously measuring many samples formed through the same manufacturing process. That is, as the measurement process progresses, image information is accumulated. The accumulation of the image information and use thereof for determination for setting image acquisition conditions negate the need to operate the device only for setting the device conditions.

The previously acquired images include variation in pattern size, brightness at pattern edges, and pattern noise due to process variation. Use of data of the image group can verify variation in the case of changing the image acquisition conditions without using a device or a sample. In the device of this embodiment, which will be described below, the image acquisition conditions are changed using the data of the image group including process variation.

Use of the image group including process variation acquired by automatic measurement negates the need to use the device or a sample again for verifying change of image acquisition conditions, thereby allowing changing off-line. Furthermore, mass production can be developed in a short time period. Accordingly, even a user who cannot have tried correction concerning matching error can easily perform change.

Embodiment 1

FIG. 1 is a schematic configuration diagram of a CD-SEM. A primary electron beam 104 drawn from a negative pole 101 by a voltage V1 applied to a first positive pole 102 is accelerated by a voltage Vacc applied to a second positive pole 103 and travels toward a lens system on a succeeding stage. The primary electron beam 104 is converged as a minute spot on a sample 107 by a converging lens 105 and an objective lens 106 controlled by a lens control power source 114, and two-dimensionally scans the sample 107 by means of two stages of deflection coils 108.

Scanning signals for the deflection coils 108 are controlled by a deflection controller 109 in conformity with an observation magnification. A secondary electron 110 emitted from the sample by the primary electron beam 104 scanning the sample 107 is detected by a secondary electron detector 111. Information on the secondary electron detected by the secondary electron detector 111 is amplified by an amplifier 112 and displayed on a display of a computer 113.

The process of manufacturing a semiconductor device processes a silicon wafer to manufacture a semiconductor device. The wafer is adopted as the sample 107. A circuit pattern in the middle of manufacturing is displayed on a screen of the display of the computer 113, which allows an operator to observe a manufacturing failure of the circuit pattern and an adhering foreign body. Some CD-SEMs have a function of automatically measuring the width of a circuit pattern using secondary electron information. The process using the image information and the template matching identifying a desired pattern from the image are performed in an operation unit in the computer 113. Images used for template matching and an automatic measurement file for automatic measurement are registered in a storage in the computer 113. The automatic measurement is performed on the basis of the registered information. The acquired image is registered in a data accumulation unit in the computer 113.

Figure 2:
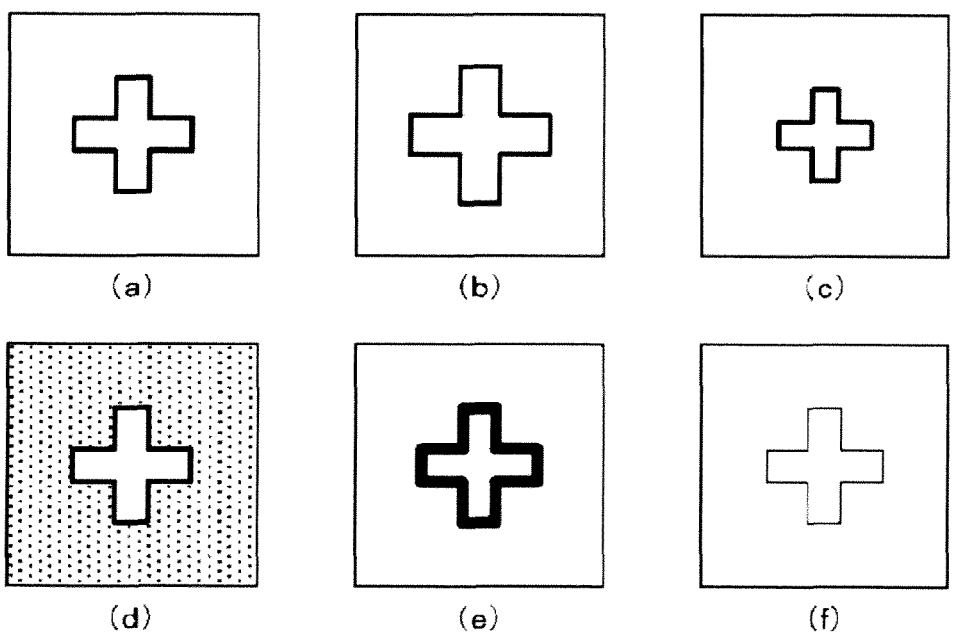
FIG. 2 is a diagram showing examples of images acquired by the scanning electron microscope.

FIG. 2 schematically shows images acquired by automatic measurement by a CD-SEM. In the case of adopting FIG. 2 (a) as a standard, (b) has a large pattern size and (c) has a small pattern size. There is what has a large noise as with (d). These images include an image having a strong pattern edge as with (e) and an image having a weak pattern edge as with (f). The differences between images (a) to (f) occur owing to effects of process variation or differences in layer, even in the case of automatic measurement with the identical image acquisition conditions. The differences of images (d) to (f) also appear owing to differences in the number of integrations, which is one of the image acquisition conditions. The larger the number of integrations, the stronger the pattern edge is and the lower the noise is. The smaller the number of integrations, the weaker the pattern edge is and the higher the noise is. The differences of images (a) to (f) affect scores acquired by matching with the template.

In particular, in the case of an image with high noise and a weak pattern edge, the pattern is not successfully detected, which tends to cause a matching error. The score will now be described. For instance, the score represents a degree of matching with the template from 0 to 1000. Complete matching is represented as 1000. The lower the degree of matching, the lower the score becomes. In the CD-SEM, in order to prevent erroneous detection, an acceptance is set as a reference value for determining presence or absence of a target pattern. The acceptance is a threshold set automatically or by a user. If the score is at least the acceptance, it is determined that the pattern is successfully detected. Instead, if the score is equal to or less than the acceptance, it is determined that matching error occurs.

Figure 3:
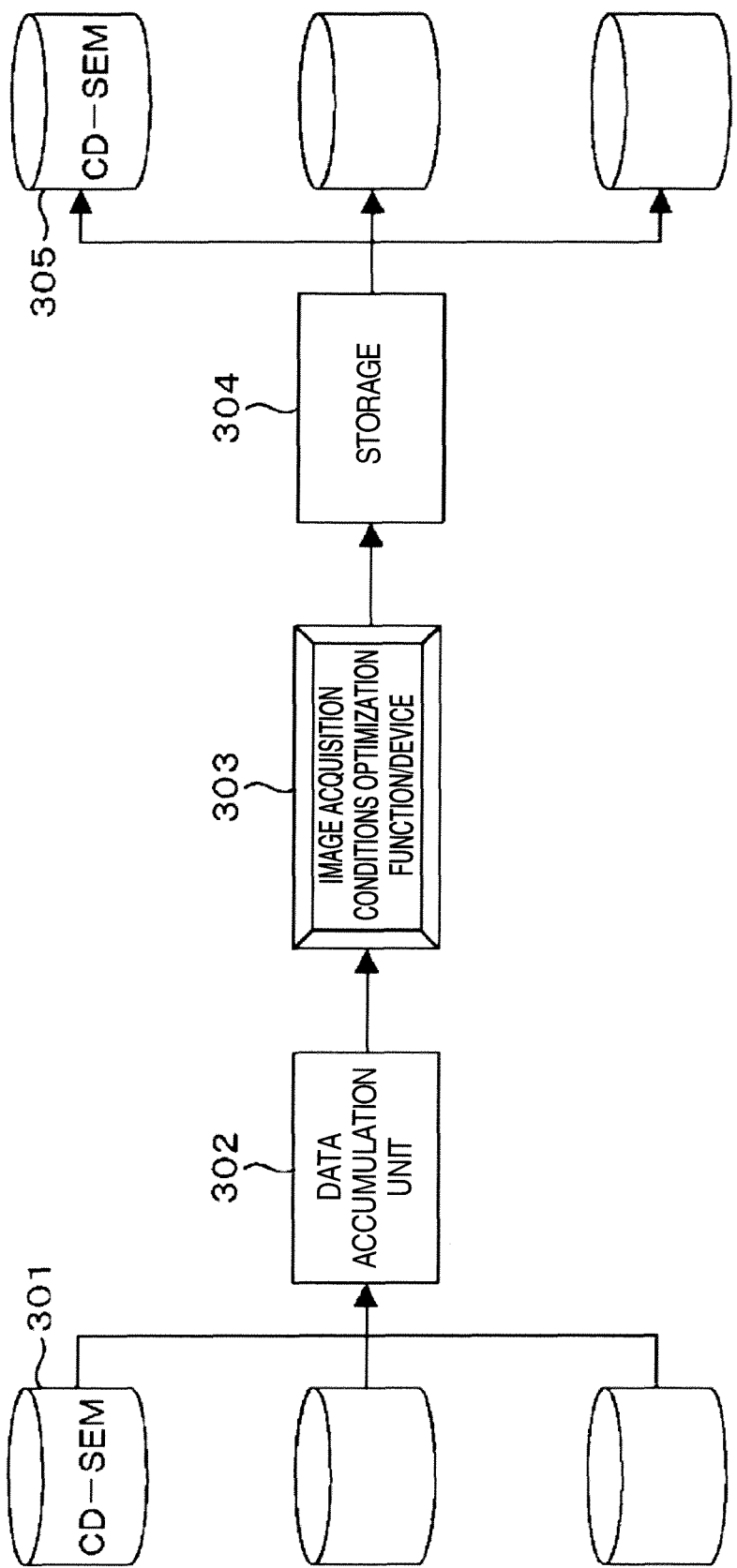
FIG. 3 is a schematic configuration diagram of the scanning electron microscope and a device for setting image acquisition conditions.

FIG. 3 is a schematic configuration diagram of the CD-SEM and image acquisition conditions optimization function/device. An image acquired by a CD-SEM 301 is accumulated in a data accumulation unit 302 residing in the computer 113 in FIG. 1. As necessary, the image is transmitted to an image acquisition conditions optimization function/device 303. The image acquisition conditions optimization function/device 303 optimizes the image acquisition conditions. A result calculated here is transmitted to a storage 304 residing in the computer 113 in FIG. 1, and registered again as new setting content of automatic measurement. A CD-SEM 305 performs automatic measurement with the new setting content.

The image acquisition conditions optimization function/device 303 in FIG. 3 will now be described in detail with reference to FIG. 4. First, image data accumulated in a data accumulation unit 401 is transmitted to an image acquisition conditions optimization function/device 409. A conversion unit 402 of the number of integrations converts the data into a plurality of images with the number of integrations. The converted images are transmitted to a pattern matching unit 403 at any time, which matches each image with the number of integration with the template to thereby acquire the score.

The acquired score is temporarily accumulated in a matching result (score) accumulation unit 404. Meanwhile, in the case where the optimization target is a length measurement image, there is a possibility where the measured length varies owing to contamination or variation in shrinkage according to the number of integrations. Accordingly, it is required to verify that the measured length is within a control value, in addition to the acceptance. Thus, while the image converted by the conversion unit 402 of the number of integrations is transmitted to the pattern matching unit 403, the image is transmitted to a length measurement unit 405 in parallel. Length measurement with each image with the number of integrations acquires the measured length. The measurement result is accumulated in a length measurement result accumulation unit 406.

Accordingly, verification of the results accumulated in the matching result accumulation unit 404 and the length measurement result accumulation unit 406 allows a simulation of the case of changing the number of integrations, which is one of the image acquisition conditions. A score average, variation in the scores (3σ), a length measurement average, and a length measurement reproducibility (3σ) are calculated from the accumulated information. A filter unit 407 automatically determines the optimal number of integrations from the calculated result, thereby determining optimum conditions.

Figure 5:
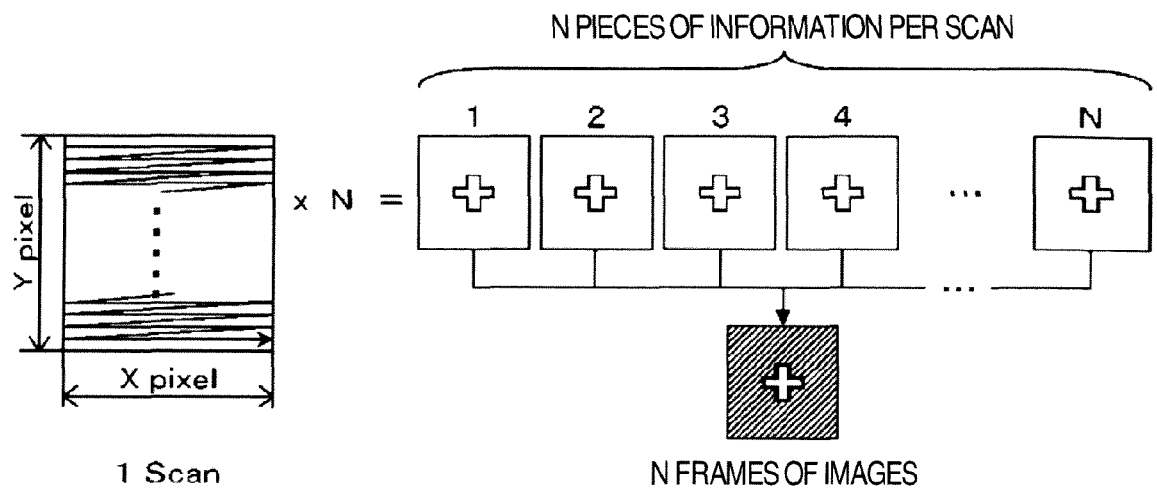
FIG. 5 is a diagram illustrating an example of an image formed on the basis of integrations of plural pieces of image data.
Figure 6:
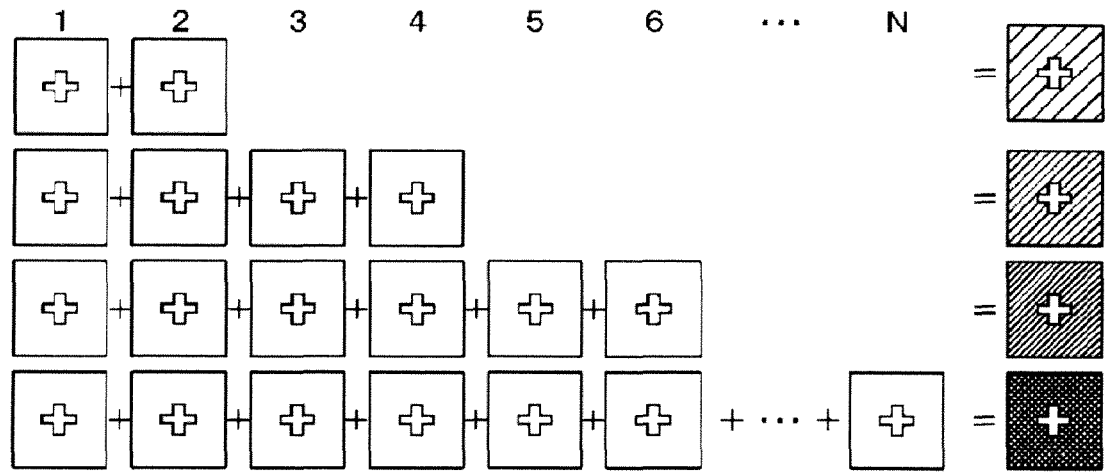
FIG. 6 is a diagram illustrating an example of forming images with different number of integrations on the basis of a plurality of integrated images.

The conversion unit 402 of the number of integrations in FIG. 4 will now be described in detail with reference to FIG. 5. Image data in the data accumulation unit 401 includes gradation values of respective pixels per scan. For instance, in the case of the image with the number of integrations N (N frames), N times of scans are repeatedly performed as shown in FIG. 5, and one image is generated from the data. Thus, N pieces of data exist. Use of the N pieces of data can generate images with 2 frames, 4 frames, 6 frames to N frames at the maximum as shown in FIG. 6. The number of generated frames can be automatically or arbitrarily set.

Figures 7, 8:
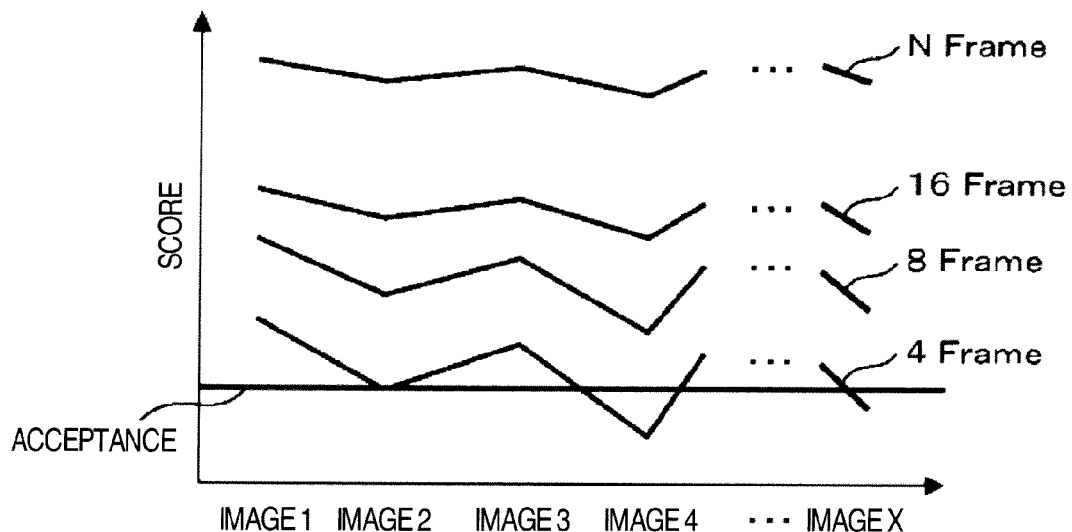
FIG. 7 is a diagram showing a graph of scores in the case where a plurality of images according to different numbers of integrations are formed on the basis of a plurality of evaluation target images, and template matching is performed on the images.
FIG. 8 is a diagram showing an example of a table representing an average and variation of scores of the numbers of integrations.

The pattern matching unit 403 in FIG. 4 will now be described in detail with reference to FIG. 7. After the images with the respective numbers of integrations are transmitted from the conversion unit 402 of the number of integrations to the pattern matching unit 403, matching with the template registered in the automatic length measurement file in the storage of the computer 113 in FIG. 1 is performed on each image. As exemplified in FIGS. 5 and 6, a plurality of images with the numbers of integrations can be generated from one image. Accordingly, a plurality of scores per image can be acquired as shown in FIG. 7. Likewise, acquisition of scores of images 2 to X allows the score average and the variation in the scores ($3\sigma$) of each number of integrations to be calculated. Here, it is provided that the calculated result is shown in FIG. 8.

Figure 4:
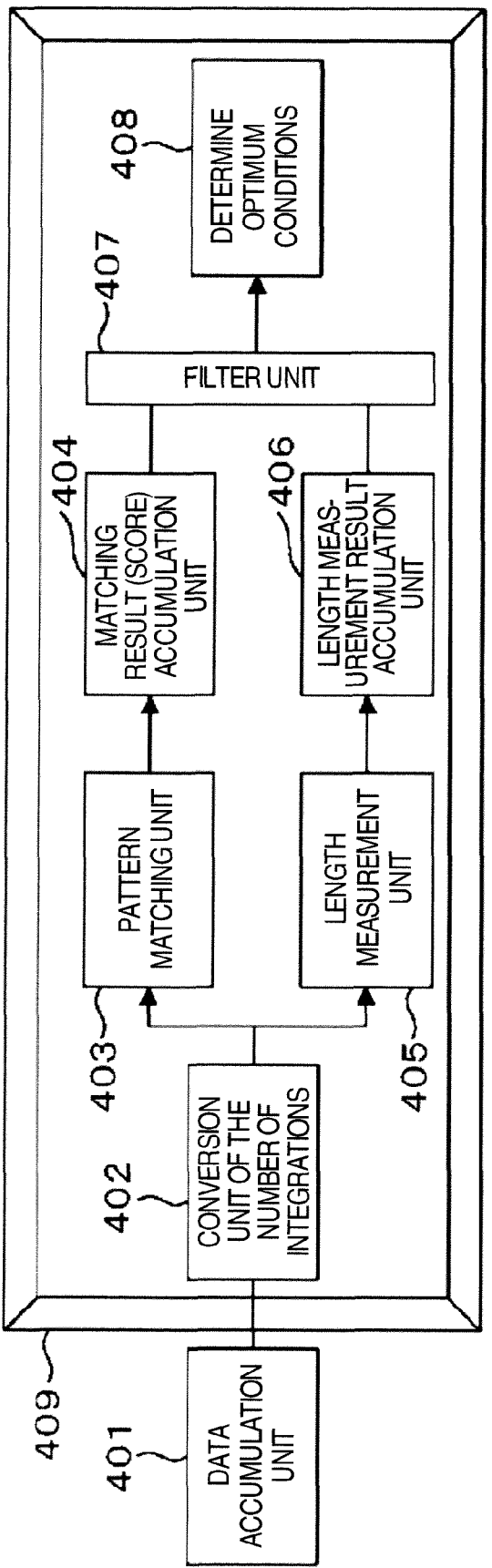
FIG. 4 is a diagram illustrating the device for setting image acquisition conditions in detail.

Meanwhile, the filter unit 407 in FIG. 4 determines the optimal number of integrations on the basis of the acceptance registered in the automatic measurement file and an arbitrarily set allowable value of the variation in the scores. That is, the filter unit 407 functions as a selection unit that selects a candidate of the number of integrations or the final number of integrations.

Figure 9:
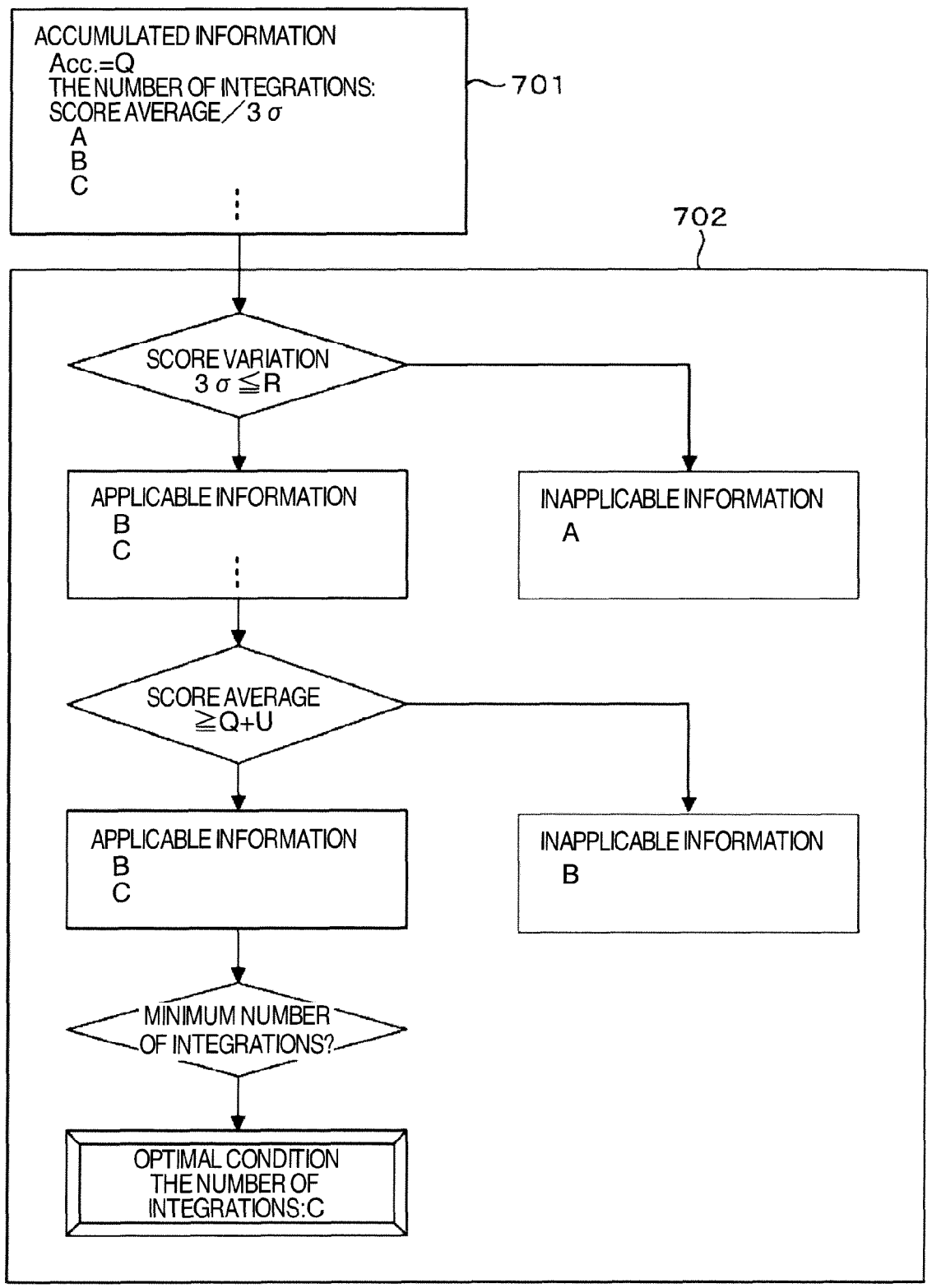
FIG. 9 is a flowchart illustrating a step of determining the optimal number of integrations on the basis of the scores of pattern matching.

Here, FIG. 9 exemplifies a matching result determination flowchart. In a matching result accumulation unit 701, the score average and the variation in the scores ($3\sigma$) with each number of integrations are calculated as described above. The information is transmitted to a filter unit 702, and, first, it is determined whether the variation in the scores ($3\sigma$) is within the allowable range or not. Here, it is provided that, if a value where $3\sigma$ is within R is the allowable value, a plurality of applicable conditions exist. Next, it is determined whether the score average is higher than the acceptance set in the automatic length measurement file by at least a certain amount U or not.

Figure 10:
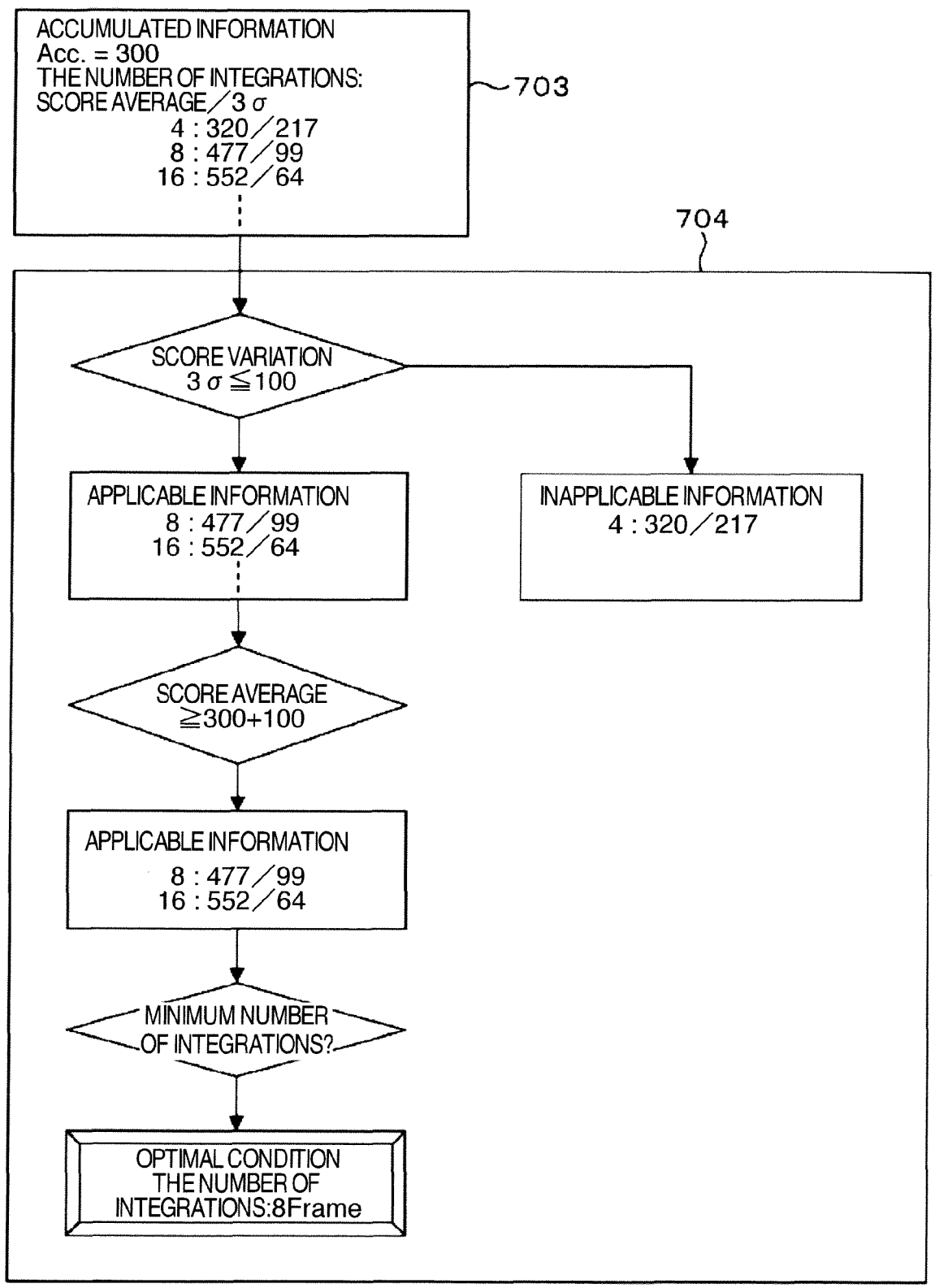
FIG. 10 is a flowchart illustrating a step of determining the optimal number of integrations on the basis of the scores of pattern matching.

This is because errors may frequently occur if the difference from the acceptance is not at least the certain amount. If a plurality of applicable conditions exist at this stage, a condition with the smallest number of integrations is determined as the optimum condition. Here, FIG. 10 shows a determination example in the case of FIG. 8. For instance, provided that the acceptance Q set in the automatic length measurement file is 300, the allowable value R of the variation in the scores ($3\sigma$) is 100, and the certain amount U is 100, it is determined that 8 frames or more is optimal.

Next, the length measurement unit 405 in FIG. 4 will be described in detail with reference to FIGS. 11 and 12. After the images with the respective numbers of integrations are transmitted from the conversion unit 402 of the number of integrations to the length measurement unit 405, length measurement with the same condition as the length measurement method registered in the automatic length measurement file is performed on each image. As described above, plural images with the numbers of integrations can be generated from one image. Accordingly, a plurality of measured lengths can be acquired on the basis of one image as in FIG. 11. Likewise, acquisition of measured lengths with the respective numbers of integrations on images 2 to X allows the length measurement average and the length measurement reproducibility ($3\sigma$) to be calculated. Here, it is provided that the calculated result is shown in FIG. 12.

Figure 13:
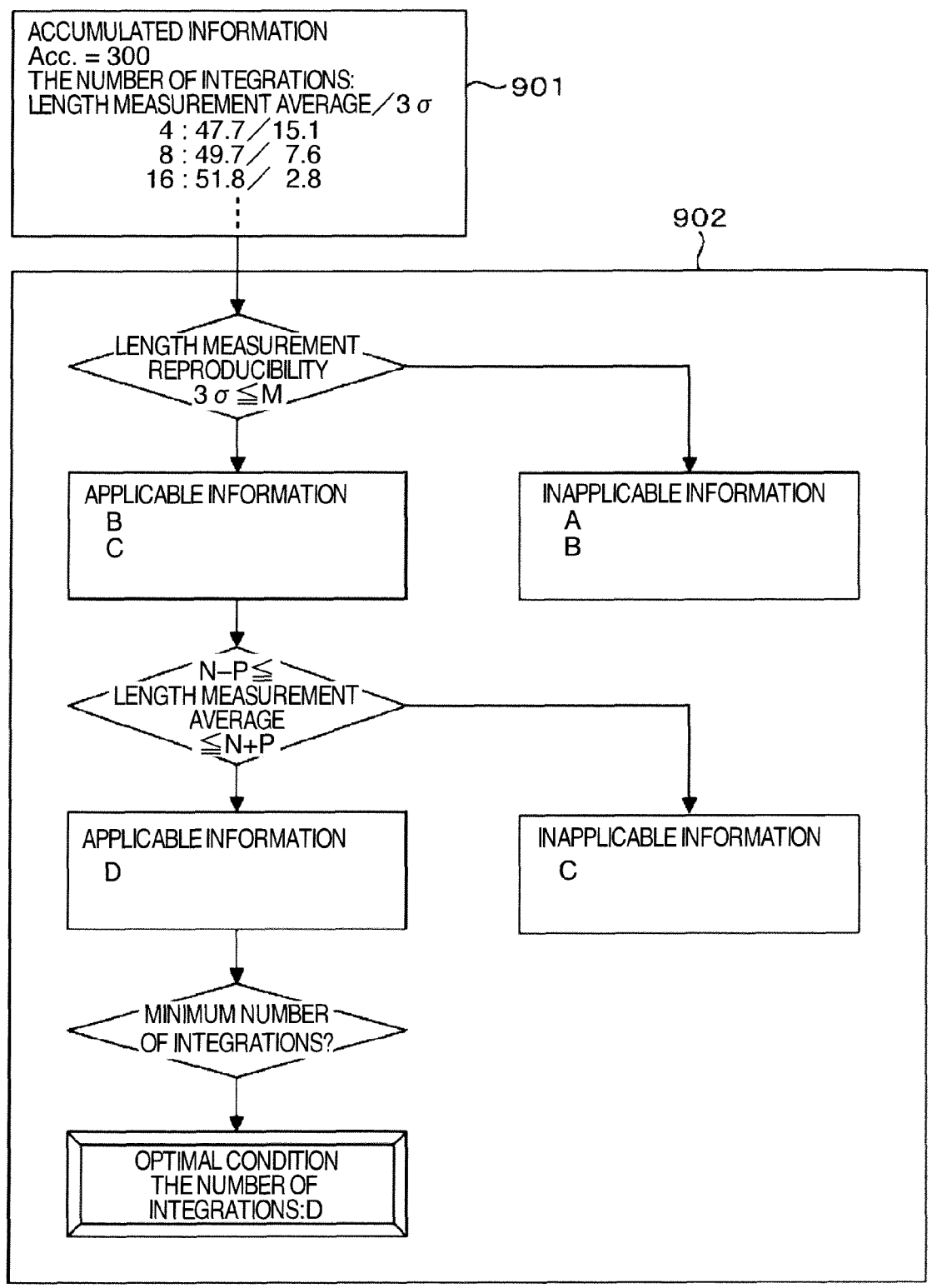
FIG. 13 is a flowchart illustrating a step of determining the optimal number of integrations on the basis of measurement result.

Meanwhile, the filter unit 407 determines the optimal number of integrations on the basis of the length measurement managing value set in the automatic measurement file and the automatically or arbitrarily set length measurement variation ($3\sigma$). Here, FIG. 13 shows a measurement length result determination flowchart. In a length measurement result accumulation unit 901, the length measurement average and the length measurement reproducibility ($3\sigma$) with each number of integrations are calculated, as described above. The information is transmitted to a filter unit 902, and, first, it is determined whether the length measurement reproducibility ($3\sigma$) is within the allowable range or not. Here, it is provided that, if a value where the allowable value is $3\sigma$ is within M, a plurality of applicable conditions exist. Next, it is verified whether the length measurement average falls within the length measurement managing value set in the automatic length measurement file. This is because, change in the number of integrations prevents the measured length from being significantly changed. If a plurality of applicable conditions exist at this stage, a condition with the smallest number of integrations is determined as the optimum condition.

Figures 11, 12:
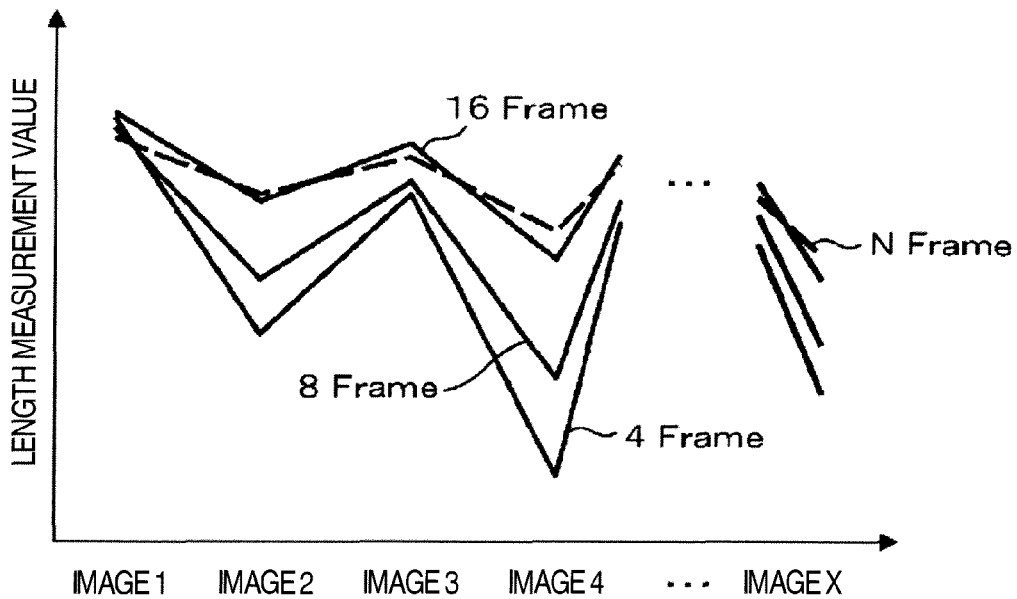
FIG. 11 is a graph showing a relationship between the numbers of integrations and measured lengths.
FIG. 12 is an average and variation of measured lengths according to the numbers of integrations.
Figure 14:
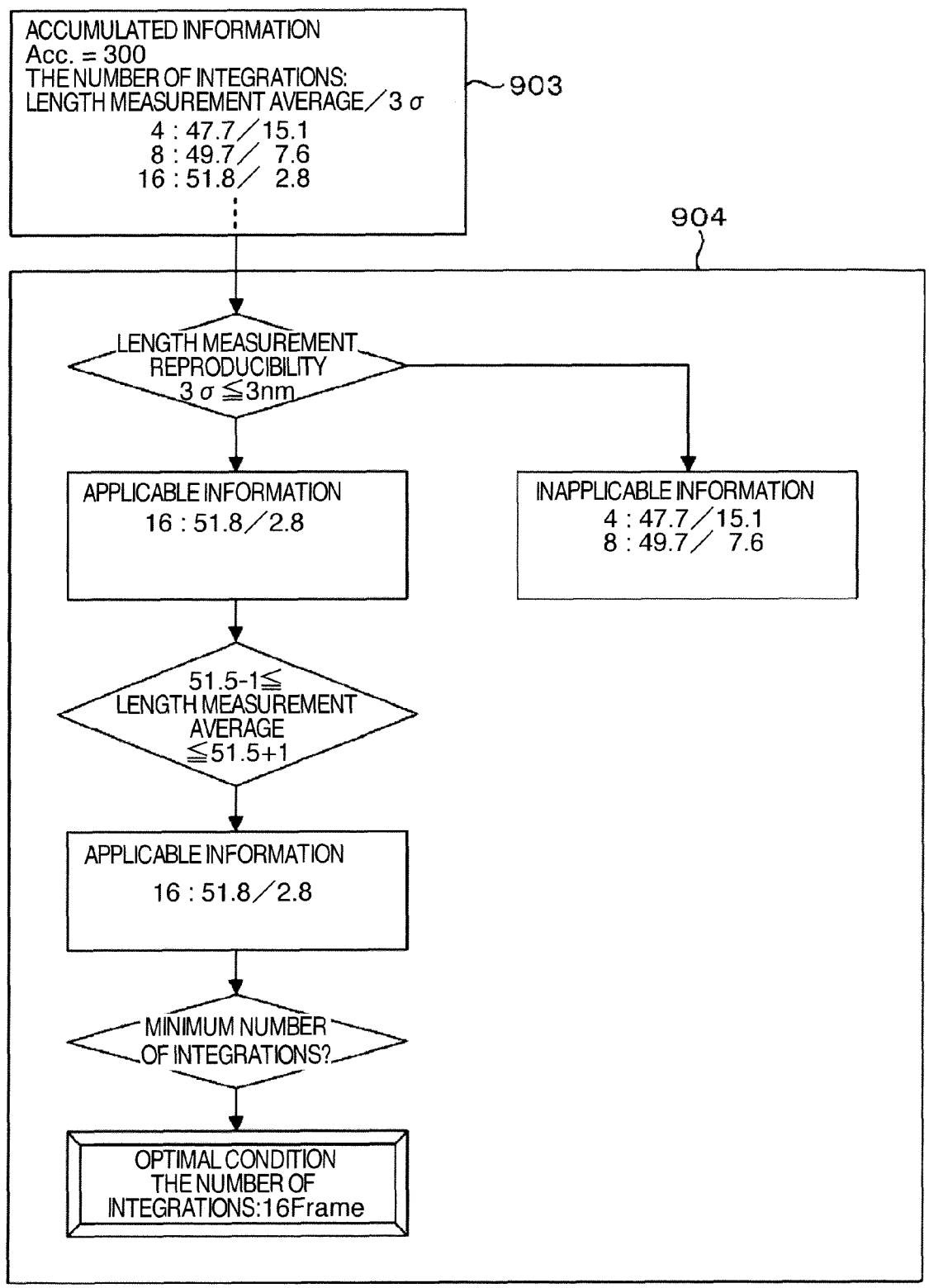
FIG. 14 is a flowchart illustrating a step of determining the optimal number of integrations on the basis of measurement result.

Here, a determination example in the case of FIG. 12 is shown in FIG. 14. For instance, provided that the set length measurement managing value (N±P) is within 51.5 nm±1 nm and the length measurement reproducibility M is within 3 nm, 16 frames or more is determined optimal. Even if the pattern matching result is determined such that 8 frames is optimal, determination of the measurement result has precedence in the case of the length measurement image.

FIG. 18 is a flowchart illustrating a process of determining image acquisition conditions. After processing is started, image data is read from a storing medium accumulating the images (step 1201). Image data for forming one image includes plural pieces of data of images to be integrated. Accordingly, a plurality of images including the different numbers of integrations are formed using these pieces of image data (step 1202). For instance, a plurality of images including the different numbers of integrations, for instance, one, two, three, . . . , N are formed. In the case where a operation device preliminarily forming the images with the different numbers of integrations, and a storing medium accumulating the differently integrated images are provided, step 1202 is not required.

Next, template matching is performed on the integrated image, thereby acquiring the score (step 1203). The template matching process is performed on each image with the different number of integrations, thereby acquiring a plurality of scores (degree of matching between the template and the position specified by the template) on one evaluation target image (step 1204). Next, the process of acquiring a plurality of scores is performed even on a different evaluation target image, thereby acquiring a plurality of scores on the evaluation target images (step 1205). The scores acquired as described above are compared with the preset acceptance (step 1206). The number of integrations having a score of at least the acceptance on every evaluation target image is selected (step 1207). The acceptance is a threshold for determining whether matching succeeds or not. Accordingly, it can be considered that the number of integrations where all the scores exceed the acceptance is the image acquisition condition where success of matching is compensated on a plurality of images acquired from the different samples (different samples acquired under the same manufacturing conditions). Thus, selection of the number of integrations from there among at least allows the matching success rate to be maintained high.

Next, the minimum one is selected from among the selected numbers of integrations (step 1208). The selection of the minimum one from among the numbers of integrations where the high matching success rate is compensated can minimize beam irradiation on the sample while maintaining the matching success rate in a high state.

Finally, the selected number of integrations is stored in a recipe as the image acquisition conditions (step 1209). The above steps allow appropriate image acquisition conditions to be set without reducing the operating ratio of the device.

Embodiment 2

On the automatic length measurement file in the CD-SEM, it is determined whether template matching succeeds or not according to the acceptance, as described above. In the case where the matching success rate is set to have priority, the acceptance may sometimes become higher than necessary.

Figure 15:
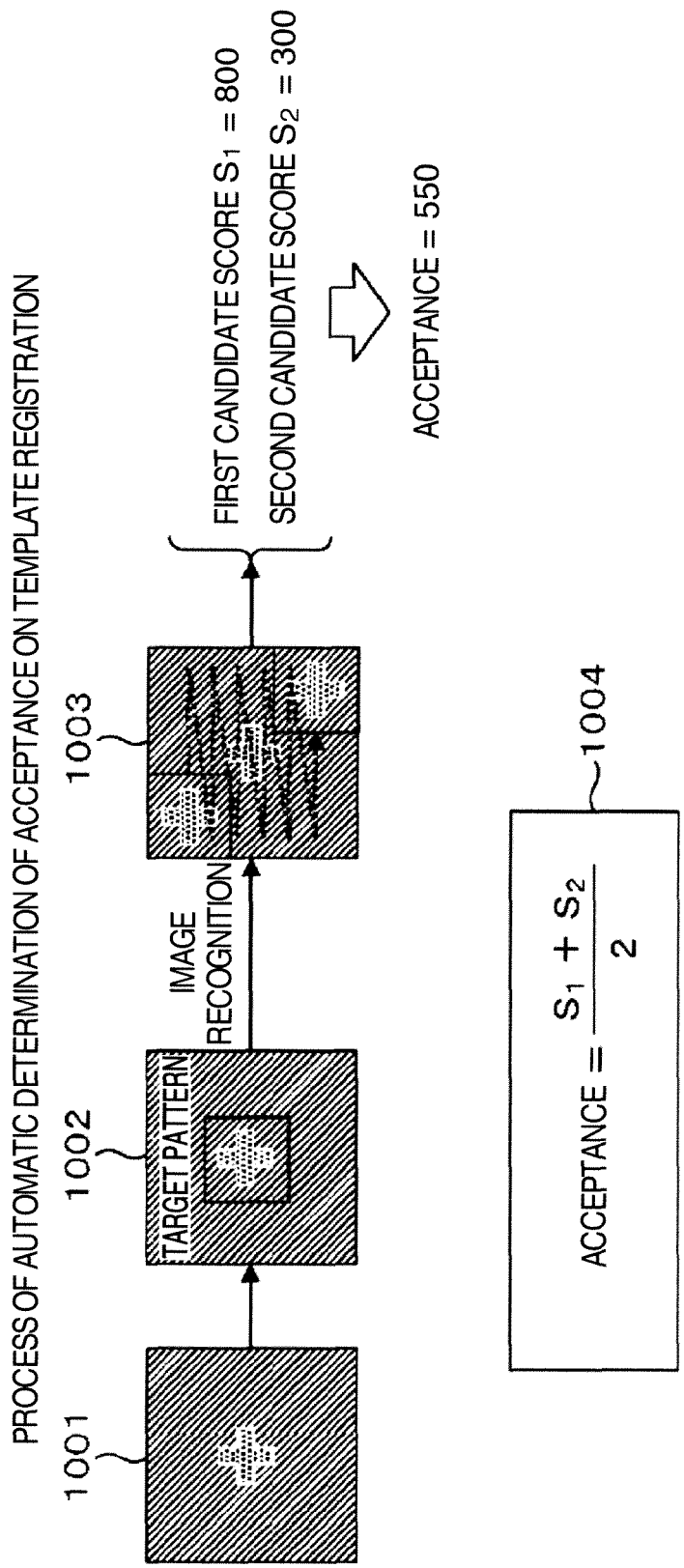
FIG. 15 is a diagram illustrating a step of determining an acceptance of a template.

Automatic determination of the acceptance will be described in detail with reference to FIG. 15. First, an image 1001 to be registered as a template is acquired. Next, a target pattern 1002 to be a target of image recognition in the acquired image is registered. At the same time of registering the target pattern, image recognition 1003 is performed with the target pattern in the acquired image. A first candidate score S1 with the highest score and a second candidate score S2 with the second highest score are extracted. The acceptance is calculated from S1 and S2. The acceptance is the average between S1 and S2. In the case where S1 is 800 and S2 is 300, the acceptance is 550.

Here, the acceptance is a value that can be set to an arbitrary value. The value can be rewritten in the case where it is determined that the value automatically determined on registration of the template is high. Thus, a method is proposed that automatically determines whether the automatically determined acceptance is optimal or not and, if the value is determined inappropriate, automatically or arbitrarily rewrites the value to an appropriate value. It should be noted that, setting the acceptance too low causes a possibility of erroneously recognizing a pattern different from the target pattern as the target pattern. In order to prevent erroneous recognition, a minimum value Qmin with an acceptance that can be preset is determined.

Figure 16:
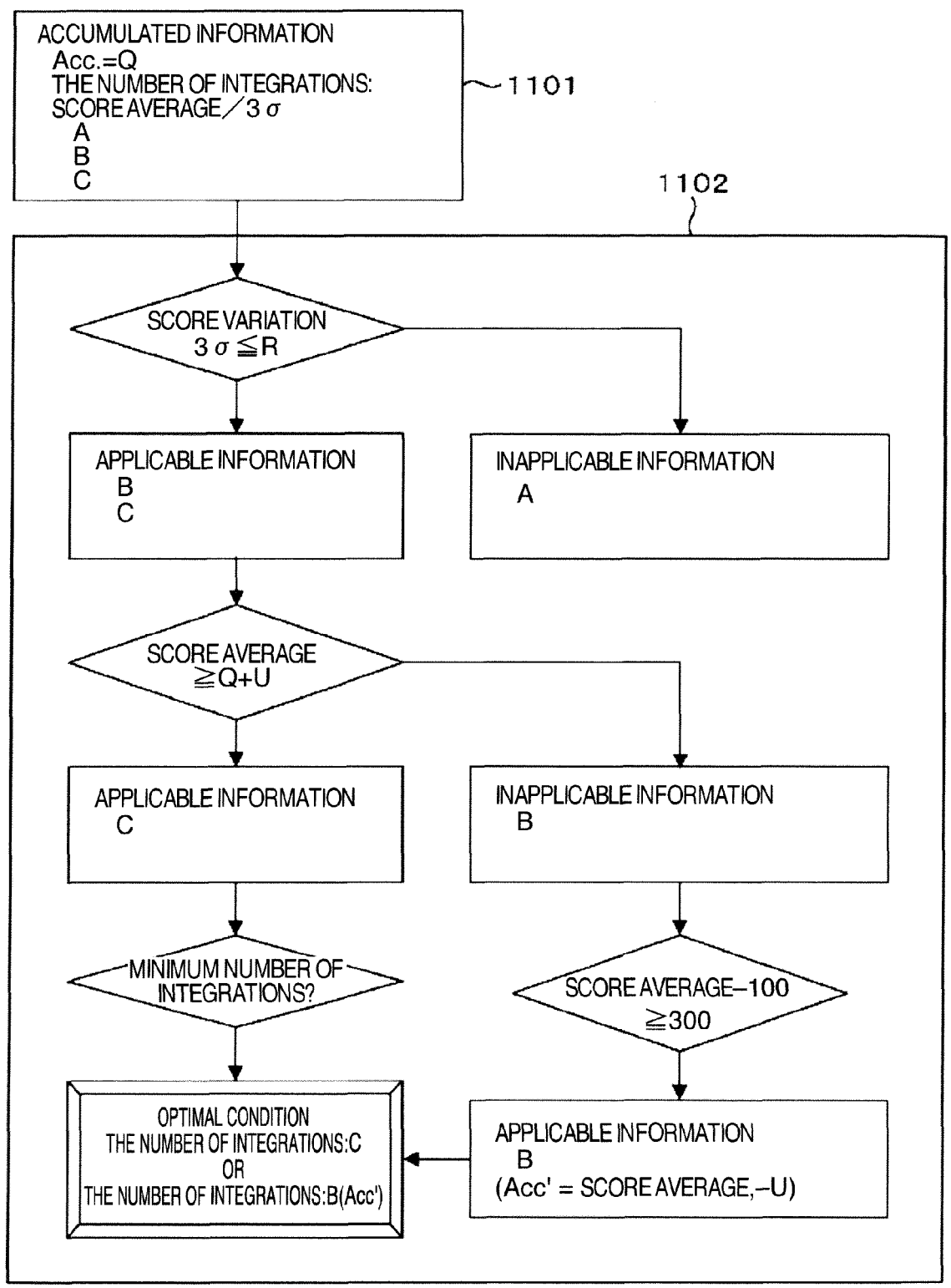
FIG. 16 is a flowchart illustrating a step of setting the optimal acceptance on the basis of the score of pattern matching.

Even without difference between the acceptance and the score average, errors frequently occur. Accordingly, the acceptance is required to be set such that at least a certain difference is secured. FIG. 16 exemplifies an acceptance optimization flowchart in consideration therewith. If the acceptance is high, the variation in the scores (3σ) is small. Accordingly, even with a high score average, the verification of score average 1103 unfortunately processes the condition as an inapplicable condition. Here, it is verificated whether the score average of the inapplicable conditions is at least a minimum acceptance Qmin and the certain amount U of difference is secured or not. If the condition is met, reduction in acceptance allows adoption of the condition where the number of integrations is further reduced.

It is provided that the optimal acceptance value is a value acquired by subtracting the certain amount U from the score average of the inapplicable condition. However, it can be automatically or arbitrarily selected whether to adopt a condition with a reduced acceptance or not. That is, the optimum condition is selected from between two cases, or the case where the acceptance is not optimized and the case where the acceptance is optimized (a plurality of conditions if, on optimization, a plurality of applicable conditions exist). In the case of setting optimization to be automatic, it can be preset whether to select acceptance-optimized one or not.

Figure 17:
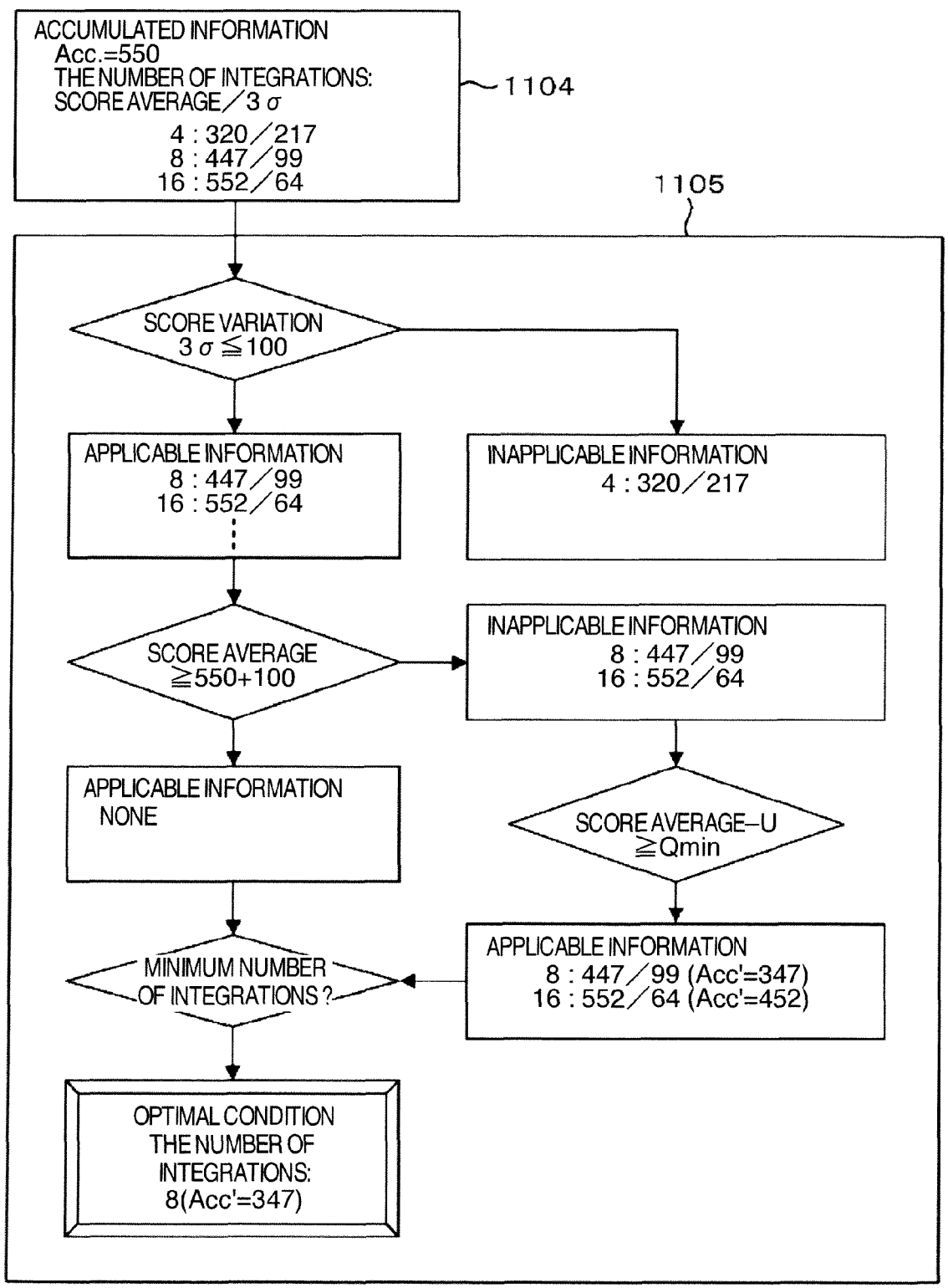
FIG. 17 is a flowchart illustrating a step of setting the optimal acceptance on the basis of the score of pattern matching.

Here, FIG. 17 shows an example of simulation based on the result in FIG. 8. In the case where the acceptance Q registered in the automatic length measurement file is 550, the allowable value R of the variation in the scores (3σ) is 100, the certain amount U is 100, and the minimum acceptance Qmin is 300, it is determined that the number of integrations is required to be at least 16 unless the acceptance is optimized. In the case where the optimization of the acceptance is valid, the number of integrations can be reduced to 8 frames.

REFERENCE SIGNS LIST 101 negative pole
102 first positive pole
103 second positive pole
104 primary electron beam
105 converging lens
106 objective lens
107 sample
108 deflection coils
109 deflection controller
110 secondary electron
111 secondary electron detector
112 amplifier
113 computer
114 lens control power source
301, 305 CD-SEM
302, 401 data accumulation unit
303, 409 image acquisition conditions optimization function/device
304 storage
402 conversion unit of the number of integrations
403 pattern matching unit
404 matching result (score) accumulation unit
405 length measurement unit
406, 901, 903 length measurement result accumulation unit
407, 702, 704, 902, 904, 1102, 1105 filter unit
701, 703, 1101, 1104 matching result accumulation unit
1001 template registration image
1002 target pattern registration
1103 verification of score average

The invention claimed is:

1. A device for setting image acquisition conditions comprising:
an image integrator that integrates a plurality of image signals and forms an image; and
a pattern matcher that performs pattern matching on the image integrated by the image integration unit using a preliminarily registered template, wherein:
the image integrator changes the number of integrations on each of a plurality of preliminarily acquired integrated images, and forms a plurality of images with the different numbers of integrations,
the pattern matcher performs pattern matching between the plurality of images with the different numbers of integrations and the preliminarily registered template, and acquires a score representing a degree of matching between the template and a position specified by the template,
the device further comprises a selector that selects
the number of integrations where a variation in the scores is within a prescribed allowable range,
the number of integrations where all the plurality of integrated images represent a score of at least a prescribed value,
the number of integrations where a variation in dimensions of a pattern specified by the pattern matching is within a prescribed allowable range, or
the number of integrations where an average of dimensions of the pattern is within a prescribed range,
the number of integrations is the number of integrations of images obtained by a charged particle beam device, and
the preliminary registered template is different from the images obtained by the charged particle beam device and integrated by the image integrator.

2. The device for setting image acquisition conditions according to claim 1, wherein, if a plurality of the selected numbers of integrations exist, the selector selects a smallest number from among the selected numbers of integrations, as the number of integrations for the image integrator.

3. The device for setting image acquisition conditions according to claim 1, wherein, if a plurality of the numbers of integrations where variation in the scores is within a prescribed allowable range exist, the selector selects the number of integrations representing a score higher than a prescribed allowable value by at least a certain amount from among the selected numbers of integrations.

4. The device for setting image acquisition conditions according to claim 1, wherein the integrated image is an image where plural pieces of image data are integrated.

5. The device for setting image acquisition conditions according to claim 1, wherein the pattern matcher adopts a score between a first candidate score and a second candidate score by means of pattern matching, as a threshold for determining whether matching succeeds or not on template matching.

6. The device for setting image acquisition conditions according to claim 1, wherein the selector sets the selected number of integrations as a device condition of a charged particle beam device.

7. A non-transitory computer readable medium having executable instructions stored thereon, which when executed by a computer cause the computer to perform steps of:
   integrating image signals acquired by a charged particle beam device to form an integrated image;
   performing pattern matching on the integrated image using a preliminarily registered template;
   changing the number of integrations on each of a plurality of preliminarily acquired integrated images;
   forming a plurality of images with the different numbers of integrations;
   performing pattern matching on the plurality of images with the different numbers of integrations and the preliminarily registered template;
   acquire a score representing a degree of matching between the template and a position specified by the template; and
   selecting
      the number of integrations where a variation in the scores is within a prescribed allowable range,
      the number of integrations where all the plurality of integrated images represent a score of at least a prescribed value,
      the number of integrations where a variation in dimensions of a pattern specified by the pattern matching is within a prescribed allowable range, or
      the number of integrations where an average of dimensions of the pattern is within a prescribed range,
   wherein the number of integrations is the number of integrations of images obtained by a charged particle beam device, and
   wherein the preliminary registered template is different from the images obtained by the charged particle beam device and integrated by the image integrator.

8. The computer program according to claim 7, wherein, if a plurality of the selected numbers of integrations exist, the computer program causes the computer to select a smallest number of integrations from among the selected numbers of integrations, as the number of integrations for the image integration unit.

9. The computer program according to claim 7, wherein, if a plurality of the numbers of integrations where variation in the scores is within a prescribed allowable range exist, the computer program causes the computer to select the number of integrations representing a score higher than a prescribed allowable value by at least a certain amount from among the selected numbers of integrations.

10. The computer program according to claim 7, wherein the integrated image is an image where plural pieces of image data are integrated.

* * * * *